United States Patent [19]

Moslehi

[11] Patent Number: 5,082,517
[45] Date of Patent: Jan. 21, 1992

[54] PLASMA DENSITY CONTROLLER FOR SEMICONDUCTOR DEVICE PROCESSING EQUIPMENT

[75] Inventor: Mehrdad M. Moslehi, Dallas, Tex.

[73] Assignee: Texas Instruments Incorporated, Dallas, Tex.

[21] Appl. No.: 571,799

[22] Filed: Aug. 23, 1990

[51] Int. Cl.⁵ .............................................. H01L 21/00
[52] U.S. Cl. ..................................... 156/345; 156/643; 156/626; 118/723; 427/39; 437/250
[58] Field of Search ........................ 315/111.21, 111.51, 315/111.91; 313/231.01, 231.31; 156/345, 626, 643; 118/723; 437/250; 427/39

[56] References Cited

U.S. PATENT DOCUMENTS

| | | | |
|---|---|---|---|
| 3,958,883 | 5/1976 | Turner | 315/111.51 |
| 4,609,426 | 9/1986 | Ogawa et al. | 156/626 |
| 4,624,214 | 10/1986 | Suzuki et al. | 118/50.1 |
| 4,794,230 | 12/1988 | Seliskar et al. | 315/111.51 |
| 4,846,928 | 7/1989 | Dolins et al. | 156/626 |

FOREIGN PATENT DOCUMENTS 0155496 9/1985 European Pat. Off. ........ 315/111.51

Primary Examiner—Richard Bueker
Assistant Examiner—George A. Goudreau
Attorney, Agent, or Firm—James C. Kesterson; James T. Comfort; Melvin Sharp

[57] ABSTRACT

A semiconductor fabrication plasma property controller (100) for controlling physical properties of a fabrication process plasma medium (144) under the influence of electromagnetic gas discharge energy from a power source (38) comprises a control volume (130) disposed between the process plasma (144) and the electromagnetic gas discharge energy source (38). A control gas (128) flowing within the control volume prohibits a predetermined portion of the emitted electromagnetic energy from influencing the fabrication process plasma (144). The flow rate and/or pressure of the control gas (128) within control volume 130 is used to adjust the fraction of electromagnetic energy absorbed within process plasma (144) and to prohibit influence of a controlled fraction of the plasma-generating electromagnetic energy on the process gas, plasma stream (144). The control volume (130) absorbs the excess electromagnetic energy emitted by the power source (38).

50 Claims, 4 Drawing Sheets

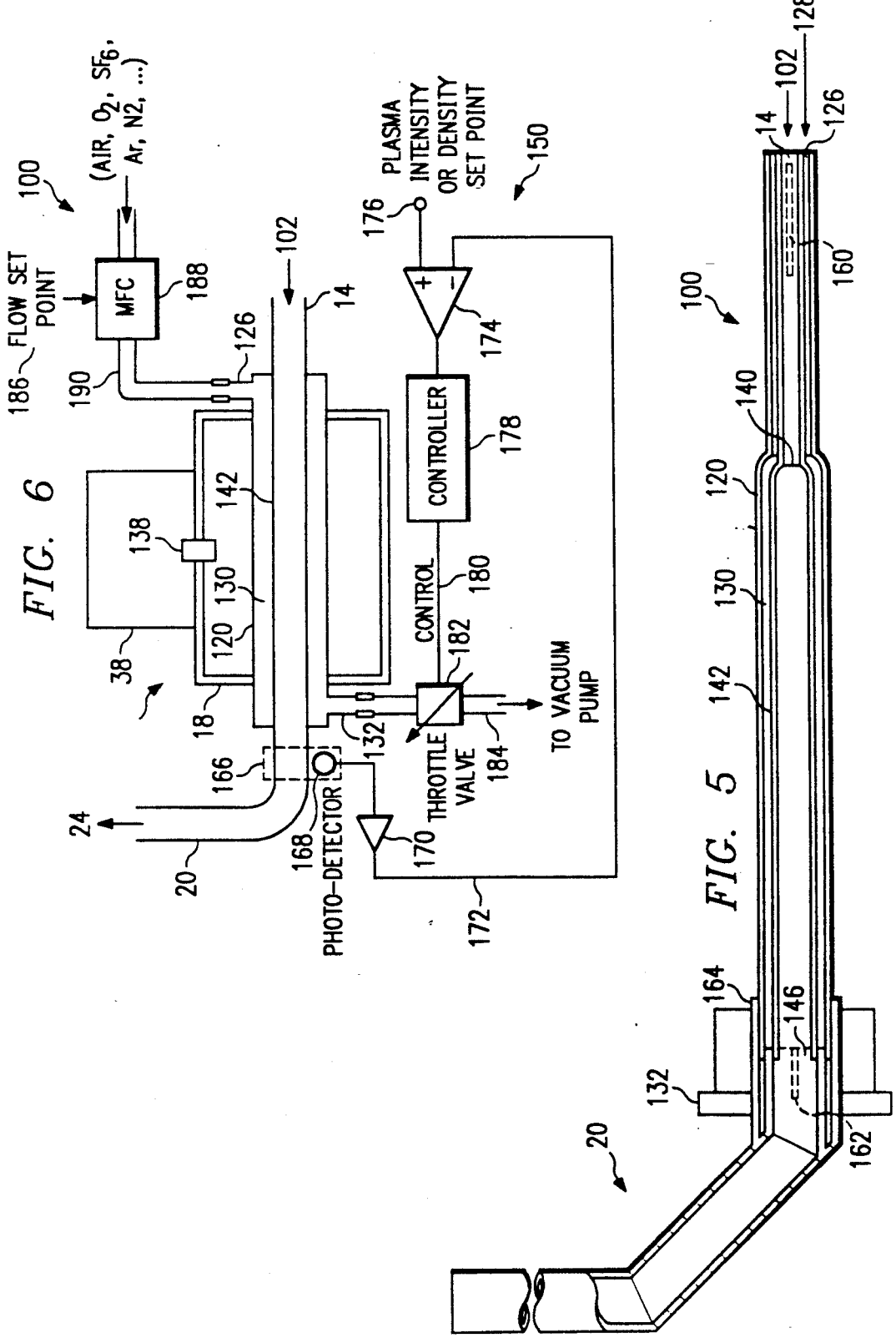

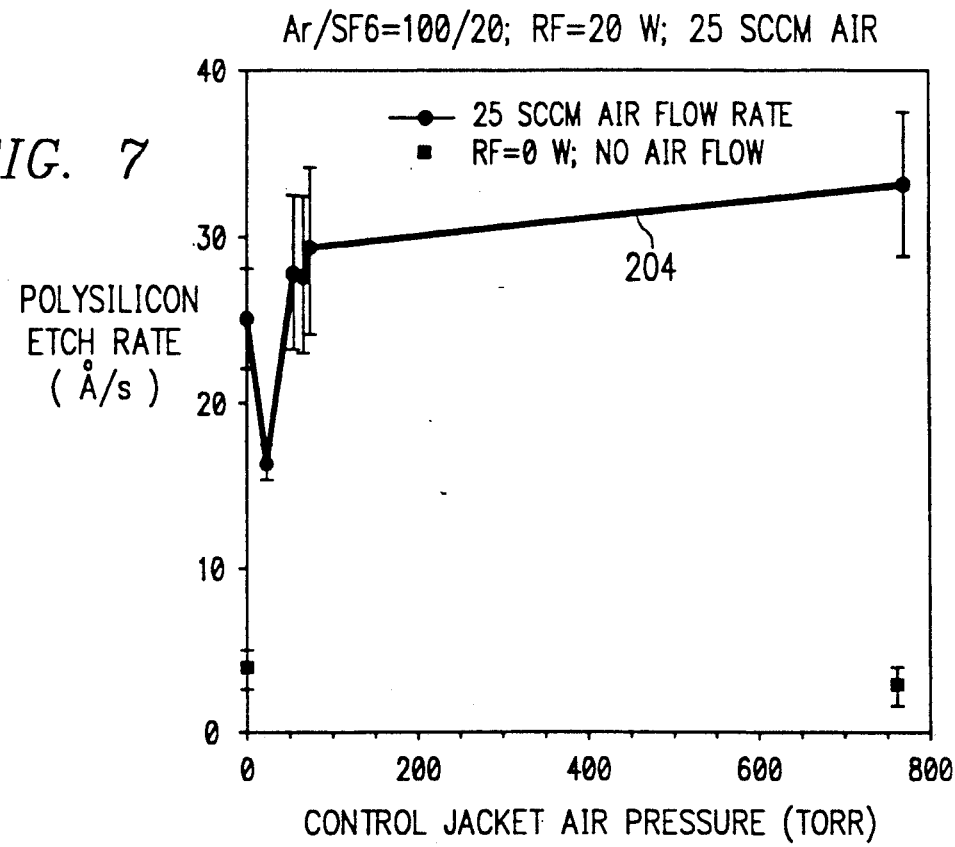
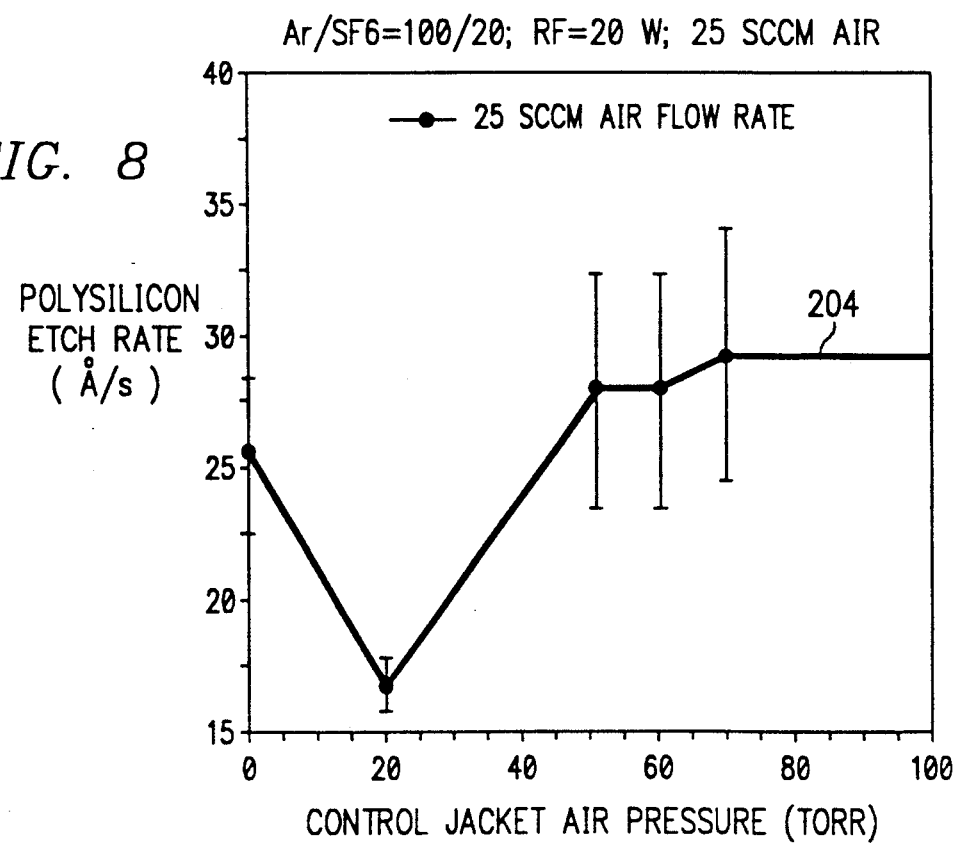

PLASMA DENSITY CONTROLLER FOR SEMICONDUCTOR DEVICE PROCESSING EQUIPMENT

TECHNICAL FIELD OF THE INVENTION

The present invention relates in general to microelectronics and semiconductor device fabrication, and more particularly to a plasma density controller for semiconductor device processing equipment that includes a plasma source and an associated real-time plasma density controller for controlling plasma density during plasma-assisted fabrication processes.

BACKGROUND OF THE INVENTION

Manufacturers of electronic components use a variety of wafer processing techniques to fabricate semiconductor devices. One technique that has many applications (e.g. deposition, etching, surface cleaning, and annealing) is a dry processing technique known as "plasma-assisted" processing. In plasma-assisted processing, a substantially ionized gas, usually produced by a DC or high-frequency radio-frequency (e.g. 13.56 MHz) or microwave (e.g. 2.45 GHz) electrical discharge, generates activated metastable neutral and ionic species that chemically react to deposit thin material layers or to etch thin films on semiconductor substrates in a plasma processing reactor. Plasma processes usually are based on gas discharge in a low-pressure (0.1 mTorr to 10 Torr) process medium for improved plasma generation.

Various applications for plasma-assisted processing in semiconductor device manufacturing include reactive-ion etching (RIE) of thin films of materials such as polysilicon, metals, oxides, and polymides; dry development of photoresist layers; plasma-enhanced chemical-vapor deposition (PECVD) of dielectrics, amorphous silicon, and other materials; low-temperature chemical-vapor deposition of planarized interlevel dielectrics; and low-temperature epitaxial semiconductor growth processes. Additional applications of plasma processing techniques include physical-vapor deposition (PVD) for thin-film deposition and cryogenic plasma etch processes for high-selectivity anisotropic etching of material layers.

In plasma-assisted processing, an important process parameter is the plasma density. Plasma density is essentially defined as the number of free electrons per unit volume of plasma medium. Plasma density directly affects the concentration of activated charged and neutral species available for chemical reactions on wafer surface and semiconductor wafer processing throughput or rate in a plasma equipment. In general, a greater plasma density produces a greater process throughput due to a larger etch, deposition, or cleaning rate. Plasma density, however, can also affect the final reliability and performance of semiconductor integrated circuits fabricated based on the plasma processing techniques. For example, if process plasma density exceeds certain critical levels, the plasma medium may generate excessive concentrations of energetic species such as energetic ions and ultraviolet photons that could cause irradiation damage to the wafer surface and semiconductor devices. Therefore, it is desireable to precisely control the plasma density in a semiconductor wafer plasma processing reactor. There are several methods for plasma generation and transport to a semiconductor wafer within a plasma processing equipment. One method is to generate the plasma medium directly in the wafer processing chamber. The conventional plasma processing techniques such as RIE and PECVD usually operate based on this method by placing the semiconductor wafer between two parallel plasma-generating electrodes. Another way of producing plasma is to generate a remote plasma away from the wafer and externally to the fabrication reactor process chamber (usually by an electrodeless RF or microwave discharge). Once produced, the remote plasma stream is introduced into the process chamber and guided towards the semiconductor wafer surface.

There are several conventional ways to produce plasma at a location remote to the fabrication reactor process chamber and semiconductor wafer. One method is to excite a process gas with a fixed output electromagnetic energy source, for example, a magnetron microwave power source that generates 2.45 GHz microwave signal at a fixed output power. An advantage of such a fixed output power level microwave energy source is its simplicity and ability to produce fabrication process plasma streams cheaply relative to other adjustable microwave energy sources. The fixed power source simply operates between an off-state (no output power) and an on-state (output power ON) to provide a constant electromagnetic power to generate the plasma stream via gas discharge. With a fixed output power source, however, there is no capability to control or adjust the electromagnetic power that the process gas absorbs in the plasma production process. Without the ability to control and adjust the gas discharge electromagnetic power that the process gas medium receives it is difficult to control process plasma density and optimize various plasma process parameters such as processing rate and uniformity.

Consequently, there is a need for a device that adjustably controls the plasma-generating electromagnetic power that a fabrication process gas receives to produce a process plasma consisting of activated charged and neutral species.

The other conventional method to remotely generate plasma is to use an electromagnetic (RF or microwave) energy source with an adjustable power level. Using known technology, variable and adjustable microwave energy sources for semiconductor plasma processing comprise a variable power source and a microwave waveguide or coaxial cable inserted between a plasma-producing microwave discharge cavity and the adjustable microwave power source. The cavity usually surrounds a discharge tube (made of quartz or sapphire) through which the process gases flow. The waveguide section or the coaxial cable connects to a variable or adjustable energy source and transfers microwave power from the source to the cavity load. Although this type of system can provide adjustable discharge power, such systems are usually more expensive than the constant output magnetron power sources and take up considerable space. Moreover, because of their complexity, variable or adjustable microwave energy sources are not necessarily as reliable as are the simpler constant output power sources such as the standard stand-alone magnetron microwave power sources.

Consequently, there is a need for an inexpensive apparatus that provides plasma-generating electromagnetic energy to process gases to variably control fabrication process plasma generation, resulting in reproducible control over the device fabrication plasma process parameters.

There is yet a need for a variable or adjustable power plasma processing energy source that does not consume significant space in a semiconductor device manufacturing clean-room environment.

There is a need for a simple and reliable apparatus and method to variably provide adjustable plasma-generating energy for process plasma generation with adjustable plasma density during a semiconductor device fabrication plasma process.

SUMMARY OF THE INVENTION

According to one aspect of the present invention, there is provided a plasma density controller semiconductor device processing equipment that controls plasma density and concentrations of activated species in a semiconductor plasma processing equipment. The present invention comprises interposing a special module between the fabrication process gas medium and the plasma-generating electrical energy source in order to control the plasma density by adjusting the amount of electromagnetic power absorbed by the process plasma medium. In the preferred embodiment, a control gas jacket surrounds the plasma generation tube or the chamber which contains the fabrication process plasma medium. The control gas jacket is placed between the plasma generation tube and a plasma-generating electromagnetic energy source and applicator. The control gas jacket fills a finite space between the plasma process gas tube and the energy source applicator. The control gas jacket itself generates a plasma and in so doing absorbs a controlled fraction of the plasma-generating electromagnetic energy from the electrical energy source. This prevents a predetermined and controlled portion of the plasma-generating energy from being absorbed by the fabrication process plasma. A plurality of controls variably adjust the important physical properties associated with the control gas jacket. These controls regulate the degree by which the control gas prohibits the plasma-generating energy absorption within the fabrication process plasma medium.

Another aspect of the present invention includes a semiconductor device fabrication plasma density controller for controlling process plasma density. The plasma density controller comprises a control gas jacket surrounding the process plasma tube and disposed between the process gas flow tube (or plasma chamber) and a plasma-generating energy source applicator. The control gas flows within the jacket and produces a control plasma medium in response to the plasma-generating electromagnetic energy source. The control plasma jacket associates with the electrical energy source and the fabrication process plasma to prevent a controlled portion of the plasma-generating power from being absorbed by the process plasma stream.

By adjusting the control plasma physical properties, the controls variably determine the extent to which the control plasma jacket prevents the plasma-generating energy from entering the process gas medium to generate and sustain the fabrication process plasma and/or to increase the process plasma density. The jacket shield comprises an insulating pure material such as quartz or sapphire surrounding the process plasma tube. In the preferred embodiment of the invention, the control gas jacket produces a plasma via electromagnetic energy absorption from a magnetron microwave power source operating at 2.45 GHz. The jacket gas controls include a mass-flow controller to adjust the flow of the control gas into the jacket and a throttle valve assembly or a variable conductance valve for controlling the gas pressure within the control gas jacket. In one embodiment of the invention, a plasma emission intensity photodetector and a closed-loop control circuit automatically adjust process plasma density according to the desired process setpoints.

A technical advantage of the plasma density controller of the present invention is that it variably controls properties associated with fabrication process plasma medium for semiconductor wafer processing. These properties include the concentrations of activated ions and neutral species in plasma.

Another technical advantage of the plasma property controller of the present invention is that it allows variable control of the gas discharge electromagnetic power that the fabrication process plasma medium receives from a fixed power energy source, such as a microwave power magnetron source.

Yet another technical advantage of the present invention is that it provides an inexpensive and compact method of variably controlling the electromagnetic energy flow into the process plasma from a constant power energy source.

Still another technical advantage of the present invention is that it can variably control electromagnetic energy that the fabrication process plasma receives without the additional space requirements of a complex variably adjustable electromagnetic energy source.

A further technical advantage of the present invention is that by simplifying the control of gas discharge electromagnetic power for producing a fabrication process plasma, the present invention provides more reliable variably controlled electromagnetic power for producing device fabrication process plasma.

BRIEF DESCRIPTION OF THE DRAWINGS

The invention, as well as modes of use and further advantages, is best understood by reference to the following description of illustrative embodiments when read in conjunction with the accompanying drawings.

FIG. 5 provides a detailed, partially cut-away drawing of a preferred embodiment of a double-wall tube of the present invention for use in a single-wafer or batch plasma multiprocessing reactor;

FIG. 6 provides a schematic block diagram of a preferred embodiment of the present invention incorporating a feedback control circuit for automatically controlling plasma properties based on the desired set points during a semiconductor plasma fabrication process;

FIG. 7 illustrates some experimental results indicating the relationship between polysilicon etch rate and control gas jacket air pressure for a fixed jacket air flow rate of 25 sccm; and FIG. 8 provides yet another expanded view of the experimental results of FIG. 7 on a more narrowly defined control gas jacket air pressure scale.

DETAILED DESCRIPTION OF THE INVENTION

A preferred embodiment of the present invention is best understood by referring to the FIGUREs like numerals being used for like and corresponding parts of the various drawings.

Figure 1:
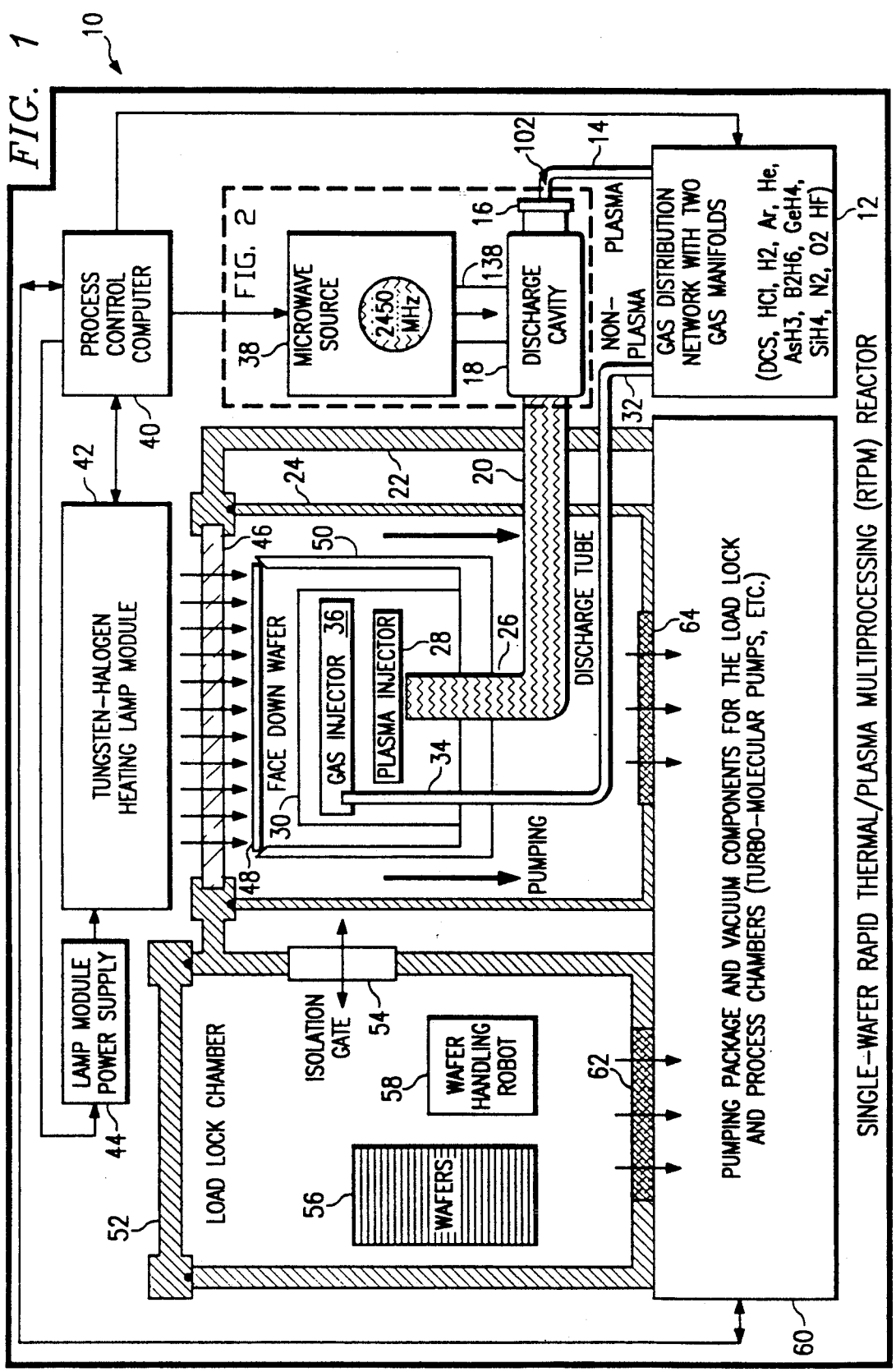
FIG. 1 is a schematic diagram of a single-wafer lamp-heated thermal/plasma semiconductor multiprocessing reactor that illustrates a representative fabrication process environment for the present invention.

FIG. 1 shows a schematic diagram of a single-wafer lamp-heated thermal/plasma processing reactor 10 that establishes a representative environment for using the plasma property controller of the present invention. Although FIG. 1 does not itself show the plasma controller module of the present invention, it is helpful in illustrating the concepts of the invention. Description of the invention itself begins at FIG. 2.

According to FIG. 1, reactor 10 includes gas distribution network 12 which outputs through plasma gas line 14 to microwave discharge tube inlet 16. Discharge tube inlet 16 connects to a plasma tube running through microwave discharge cavity 18 which outputs to remote plasma tube 20. Remote plasma tube 20 penetrates reactor casing 22 and process chamber collar 24, further penetrating support plate 26 and discharging to plasma injector shower head 28. Quartz cylinder 30 connects to support plate 26 and guides process gases including the remotely generated plasma stream towards semiconductor wafer 48.

Non-plasma gas line 32 also emanates from gas distribution network 12 connecting to gas line 34. Gas line 34, like remote plasma tube 20, penetrates through reactor casing 22, process chamber 24, and support plate 26. Gas line 34 then connects to gas injector 36 which also resides within quartz cylinder 30.

Discharge cavity 18 receives electromagnetic energy from external microwave power source 38. Process control computer 40 controls microwave power source 38, as well as other process energy sources, such as the heating lamp module 42 and lamp power supply 44. Heating lamp module 42 directs optical energy through quartz or sapphire vacuum window 46 to semiconductor wafer 48. Semiconductor wafer 48 is placed face down on three or four low thermal mass support pins 50.

Within load lock chamber 52 are wafer cassette 56 and wafer handling robot 58. Robot 58 transfers semiconductor wafers one at a time in a controlled vacuum environment between load lock chamber 52 and process chamber 24 through load lock isolation gate 54. To maintain vacuum within reactor 10, pumping package 60 connects to both load lock chamber 52 at load lock vacuum passage 62 and process chamber 24 at process chamber vacuum passage 64.

The single-wafer lamp-heated thermal/plasma processing reactor 10 of FIG. 1 is just one example of a semiconductor device fabrication reactor which may use the plasma processing system of the present invention. Other plasma processing equipment which can benefit from the plasma density controller of this invention include plasma etch equipment with hybrid RF discharge and microwave plasma process energy sources. FIG. 1 shows a single-wafer reactor 10, however, the semiconductor fabrication plasma property controller, which will be described in detail hereinbelow, of the present invention also can be used in a multiwafer or batch wafer processing system. Also, instead of using a 2.45 GHz microwave source for plasma generation, the fabrication reactor 10 may use an RF induction coil or capacitive discharge electrodes operating at other frequencies such as 13.56 MHz and surrounding the process plasma generation tube or chamber. The plasma density controller of this invention can be used both as a remote plasma generation module (wafer is placed remote from the plasma generation source such as in a remote microwave plasma processing system) as well as on a standard plasma equipment (wafer is immersed in the plasma generation environment). In the latter, the plasma density controller of this invention surrounds the main wafer processing chamber.

Figure 2:
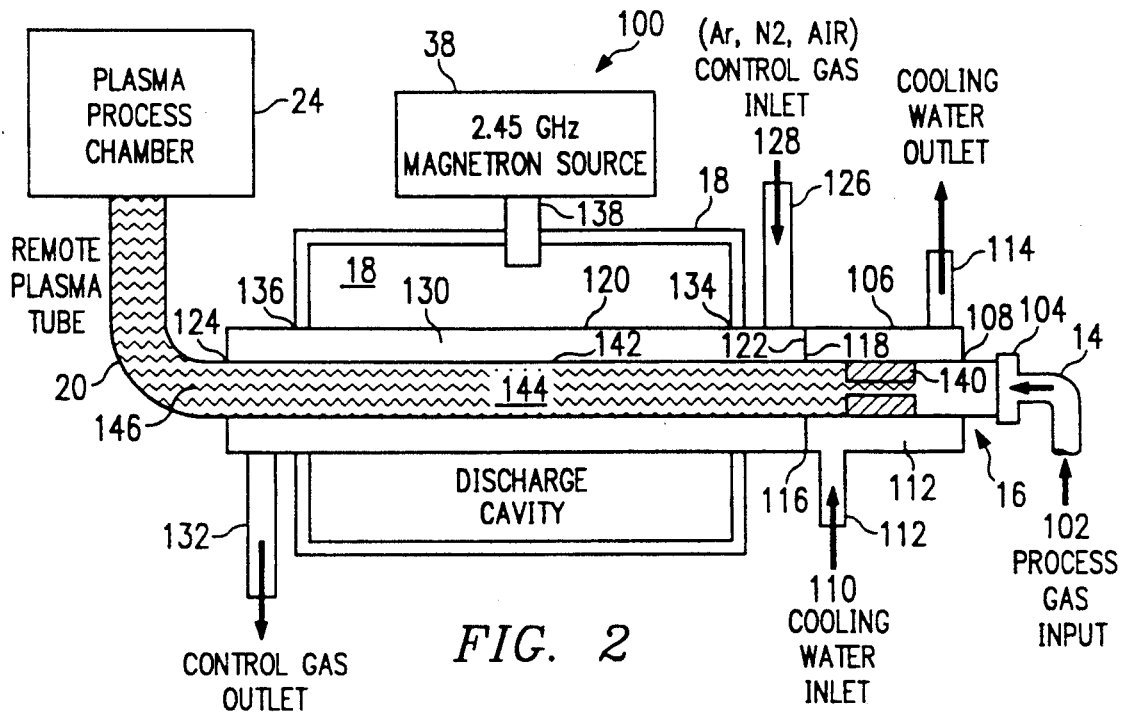
FIG. 2 is a partially cut-away schematic block diagram of the semiconductor fabrication plasma property controller of the present invention.

FIG. 2 relates to the area of FIG. 1 within the dashed line and provides a schematic cross-sectional diagram of a preferred embodiment of the present invention for a remote microwave plasma source and plasma density controller. FIG. 2 shows process plasma source and control module 100 for process plasma generation and controlling semiconductor fabrication remote plasma properties. According to FIG. 2, process gas 102 enters plasma line fitting 104 which is part of process gas delivery line 14. Plasma line fitting 104 connects to quartz or sapphire discharge tube inlet 16. Water cooling jacket 106 used for cooling the 0-ring seal affixes to discharge tube inlet 16 at fused joint 108 near the 0-ring seal. Cooling water 110 enters cooling water inlet 112 and exits through cooling water outlet 114. Seal cooling jacket 106 interfaces at water cooling jacket/control plasma jacket wall 116 and attaches to process plasma tube 142 and control plasma jacket wall 116 at fused joint 118.

Control gas jacket tube 120 surrounds plasma process discharge tube 142 and attaches to plasma process discharge tube wall 142 at fused joint 122 and fused joint 124. The double-wall discharge module consisting of process gas discharge tube 142 and control plasma jacket tube 120 extend through the entire length of plasma discharge microwave applicator or cavity 18 (shown as a rectangular microwave applicator) where electromagnetic energy is applied to the double-wall discharge module by microwave discharge cavity or applicator 18 via microwave coupling antenna 138. Control gas jacket tube 120 extends beyond the two discharge cavity 18 end walls 134, 136 and confines the jacket plasma between process plasma tube 142 and jacket plasma tube and also between two fused terminations or end walls 124, 122. Control gas inlet 126 provides a gas flow into control gas jacket 120. Control gas 128 occupies control jacket gap 130 and exits gas jacket 120 through gas outlet 132.

Microwave discharge cavity 18 (also called an applicator) surrounds control gas jacket 120 and process plasma tube 142 and encloses the double-wall discharge module between two cavity end wall feed-through joints 134, 136. Fixed-power magnetron microwave source 38 attaches to microwave discharge cavity 18 and through microwave power source coupling antenna 138 emits microwave energy within microwave discharge cavity 18 towards process gas plasma 144 and jacket gas plasma 130.

Near water cooling jacket 106, plasma discharge tube inlet 16 permits process gas 102 to enter plasma generation tube 142 via confined tube inlet 140. Microwave energy absorbed within the portion of plasma generation tube 142 surrounded by the microwave discharge cavity 18, produces plasma stream 144 from process gas 102. Remote plasma 144 passes through plasma generation tube 142 to remote plasma tube connection 146. Plasma continues flowing from there to extension plasma tube 20 and onto plasma processing chamber 24 where semiconductor substrate is placed.

Process plasma tube 142 and control gas jacket tube 120 comprise a pure electrically insulating material that interacts minimally with the electromagnetic energy from magnetron source 38 and allows lossless transmission of microwave energy. In general, quartz is a preferred material for the control gas jacket and process plasma tubes, however, where more chemically stable and inert tubing is necessary (e.g., for example, to prevent attack by fluorine), sapphire is an alternative material of choice.

The present invention allows the use of the smaller constant-power or fixed magnetron microwave source, but provides capabilities for control and adjustment of the electromagnetic microwave power that process plasma 144 receives. As a result, the present invention eliminates the high expense, complexity, and space problems that associate with a variably adjustable electromagnetic energy source. In the preferred embodiment, a control gas jacket 130 permits the flow of a control gas such as air, oxygen, hydrogen, argon, sulfur hexafluoride ($SF_6$), or almost any other gas capable of producing electrically conductive plasma under the influence of a 2.45 GHz or a radio-frequency electromagnetic gas discharge energy source. The choice of control gas and the control gas jacket thickness can strongly influence the important characteristics of the plasma density controller of this invention. Furthermore, the scope of the present invention includes interposing not only a gas, but also any alternative fluid substance or substances having the ability to variably control the amount of plasma-generating energy that the process gas plasma receives. For example, a liquid such as water can be used to flow through the control jacket 130. A liquid medium such as water in the jacket provides a lossy medium and its electromagnetic energy absorption characteristics can be adjusted or controlled by varying the liquid flow rate.

Control gas 128 generates a plasma 130 in response to the microwave energy being emitted by microwave coupling antennae 138 and passing through control gas jacket in the direction of process plasma generation tube 142. Generating the plasma from the fixed output power magnetron prevents passage of a portion of the electromagnetic energy from magnetron source 38 to plasma generation tube 142. The amount of microwave power that control gas plasma jacket 130 absorbs is directly related to the electrical conductivity of the jacket plasma and, as a result, the amounts of control gas pressure and flow rates. In this manner, the remote plasma property controller 100 of the present invention controls the fraction of emitted microwave power that process gas plasma 144 receives. Adjusting the plasma electrical conductivity within control gas jacket 130 may be done by varying the jacket pressure and/or the control gas flow rate through jacket 130.

Water cooling jacket 106 essentially cools down the end segment of plasma generation tube 142 to minimize the plasma heating effects of process plasma 144 on plasma line fitting 104 and the associated O-ring seal. This insures that the seal which separates plasma generation tube 142 from gas inlet line 14 remain cool and that the O-ring seal used to connect the gas inlet line 14 and process plasma tube 142 is not damaged by plasma-induced heating. Process plasma generation tube confined inlet 140, an orifice or other flow restriction device further separates plasma 144 from O-ring seal and process gas inlet fitting 104 connected to plasma discharge tube inlet 16. Within water cooling jacket 106, cooling water 110 absorbs and removes the heat from the inlet 16/plasma generation tube 142 interface caused by plasma-induced heating.

Figure 3:
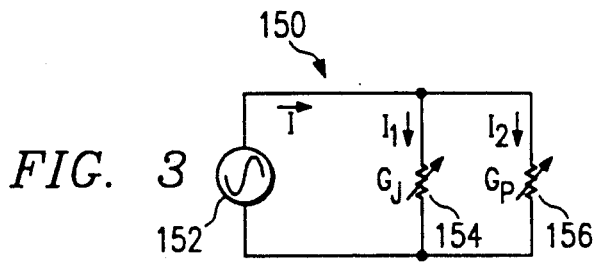
FIG. 3 is a simplified circuit diagram model conceptually depicting the power-divider relationship existing between the electrical plasma conductance of the control gas jacket used in the present invention and the electrical plasma conductance of the fabrication process plasma.

FIG. 3 provides a conceptual electrical circuit model diagram showing the relationship between the fractional absorption of gas discharge microwave power between control gas plasma jacket 130 and process plasma generation tube 130. According to FIG. 3, the relationship between the electrical conductance values of control gas plasma jacket 130 within control jacket tube 120 and process gas plasma 144 within process plasma generation tube 142 represents that of a resistive power divider circuit. Let $G_J$ represent the electrical conductance of control gas plasma jacket 130 generated in the double-wall region between plasma jacket tube 120 and process gas tube 142, and $G_P$ represent the electrical conductance of process gas plasma 144 within plasma generation tube 142. Fixed-power electrical energy source 152 is conceptually similar to a 2.45 GHz magnetron microwave power source 38 and provides electrical power to the parallel resistive circuit comprising $G_J$ and $G_P$ conductive plasma components. Consistent with the power divider concept, as $G$: increases (higher plasma density or conductivity in the control jacket), control gas plasma 130 absorbs a larger fraction of the electrical power that fixed-power electrical energy source 152 sends into power divider circuit 150. Alternatively, as $G_J$ decreases (lower plasma density or conductivity in the control jacket), more electrical power is allowed to be transmitted through control gas plasma jacket 130 and be absorbed by process plasma stream 144 (represented by $G_P$). It should be mentioned that the electrical circuit model 150 contains nonlinear and inter-dependent conductance components $G_J$ 154 and $G_P$ 156. For a fixed-power electrical source 152, a reduction in $G_J$ 154 results in an increase in $G_P$ 156, and vice versa. As a result, $G_j$ is treated as an independent variable and $G_P$ is a variable dependent on $G_j$.

The control plasma jacket 130 electrical conductivity $G_J$ 154 is controlled or adjusted by varying control jacket plasma density via adjusting control jacket 130 gas pressure and/or control gas 128 flow rate into jacket. Variation of control plasma jacket 130 electrical conductivity $G_J$ 154 results in a direct and effective modulation of process gas plasma 144 electrical conductivity ($G_P$ 156) or its plasma density.

The representation model of FIG. 3 is a very simplified one, however, it illustrates the relationship between the control gas 128 electromagnetic energy absorption within control plasma jacket 130 and that of process gas plasma within plasma generation tube 142. In this model, control gas plasma jacket 130 conductance is treated as an independent variable of which the present invention permits control and which affects directly process plasma 144 electromagnetic energy absorption. Control gas jacket electrical conductance, $G_J$, is a function of the pressure and flow rate of the control gas 128 within control gas jacket 130. Thus, as control gas pressure or flow rate varies, $G_J$ varies causing $G_P$ to be adjusted accordingly.

Figure 4:
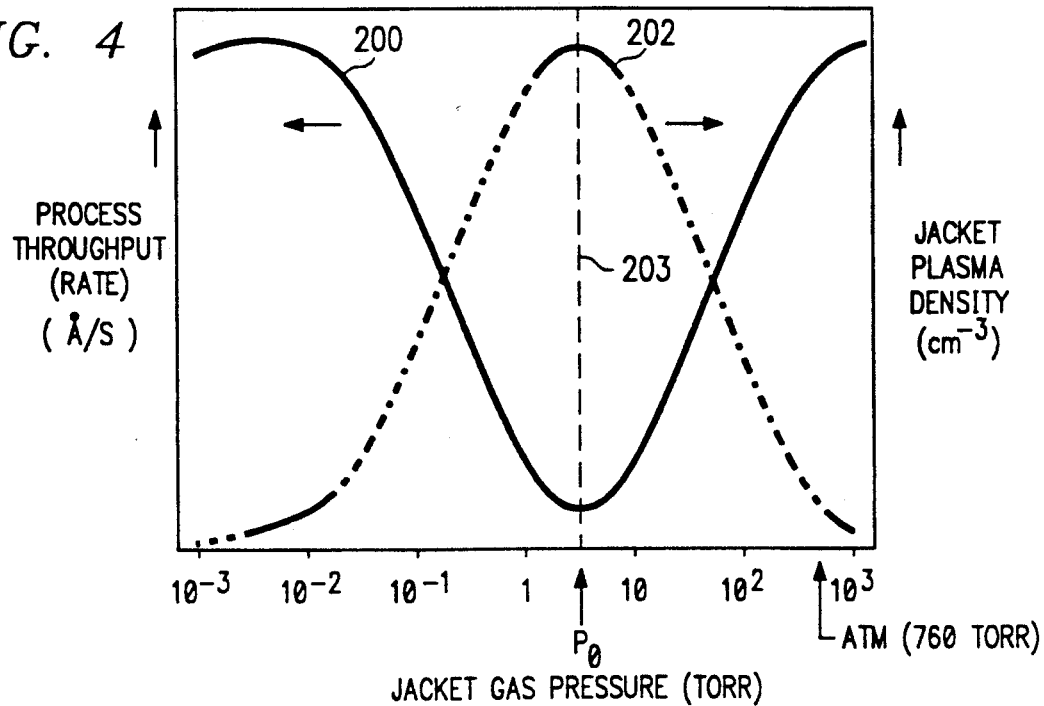
FIG. 4 is an illustrative diagram showing the relationship between semiconductor process throughput (e.g. etch or deposition rate) and control jacket plasma density across a broad range of control gas jacket pressures (for a fixed control gas flow rate)

FIG. 4 shows the qualitative relationship between process (e.g. etch or deposition) rate or throughput and control gas jacket plasma density over a range of jacket gas pressures. FIG. 4 plots process throughput or rate in angstroms per second (Å/s) as indicated on the vertical left hand axis of the plot (solid graph). The bottom horizontal axis of the plot shows control gas jacket 130 pressure range from $10^{-3}$ to $10^{+3}$ Torr (760 Torr corresponds to atmospheric pressure). The dashed graph 202 corresponding to the right hand vertical axis of FIG. 4 illustrates control gas jacket 130 plasma density in terms of number of electrons per cubic centimeter ($cm^{-3}$), also plotted versus control gas jacket pressure over several decades of gas pressure. In FIG. 4, solid graph 200 shows that for lower control gas jacket pressures (e.g. pressures below 10 mTorr), process throughput or rate begins at a near maximum level. As control gas jacket 130 pressure approaches some critical pressure, $P_O$, process throughput or rate approaches a minimum value. As control gas jacket 130 pressure is raised above the critical pressure, $P_O$, process throughput or rate is increased again until it reaches a near maximum saturation level (e.g. for pressures in the range of a few hundred Torr). These considerations are based on a constant control gas flow rate.

Graph represented by dashes line 202 shows that control gas jacket 130 plasma density has a negligible value for jacket gas pressures which are very low (e.g. less than 1 mTorr). As control gas jacket 130 gas pressure increases towards the critical pressure $P_O$, jacket plasma density (or more precisely its electrical conductivity) increases to a maximum level. Thereafter, jacket plasma density begins to fall until it reaches another minimal level (usually due to no jacket plasma) corresponding to a jacket 130 gas pressure approaching atmospheric pressure (760 Torr).

The plot of FIG. 4 further illustrates the power divider relationship between plasma density in the control gas plasma jacket 130 and electromagnetic energy absorption within plasma generation tube 142 to produce process plasma 144. Processing throughput or rate usually directly relates to plasma density of process plasma medium 144. As process plasma density increases in process discharge tube 142, processing throughput (such as etch or deposition rate) increases. With smaller values of control jacket 130 plasma density a larger fraction of the electromagnetic source 38 energy is transmitted through the control jacket 130 into process plasma medium 144, and process plasma 144 in tube 142 absorbs more electromagnetic energy. Absorbing more electromagnetic energy within process plasma tube 142 results in enhanced process plasma density and higher processing rate or throughput. The reverse changes occur when jacket 130 plasma density increases. Extremes of these phenomena occur when control gas plasma jacket 130 absorbs essentially all of the available electromagnetic power from microwave magnetron source 138. In that case, plasma within control gas jacket 130 acquires sufficiently large plasma density and plasma electrical conductivity (at a critical jacket gas pressure $P_O$) such that it essentially shields process plasma generation tube 142 so that no electromagnetic energy can reach process gas 102 to generate plasma 144. As a result, no process plasma generation occurs and processing throughput or rate will be minimized.

At the other extreme, when control jacket 130 plasma density essentially goes to zero (corresponding to a very weak plasma or no plasma in control jacket gas 130), process gas plasma receives nearly all electromagnetic power available from magnetron power source 38 to produce intense process plasma 144 with maximum process plasma density resulting in the highest processing throughput or rate. As shown in FIG. 4, this condition can be achieved at the two extreme control jacket 130 gas pressures. Between these two extreme jacket plasma conditions, variable control of processing rate or throughput is possible as a function of jacket plasma density. In fact, it is possible to operate on either side of line 203 defined by critical jacket gas pressure, $P_O$, to variably adjust and control process plasma density and processing throughput or rate over a wide range of values.

Expanding further on the representative curves of FIG. 4, with very low control gas jacket 130 pressure, process plasma density is also very low. This is because the concentration or volume number density of control gas molecules within control gas jacket 130 is very low. As a result, a very small or negligible fraction of the available magnetron power is absorbed (and reflected) by control jacket gas 130 and most of the microwave power is absorbed by process plasma 144. Up to critical pressure $P_O$, as jacket 130 gas pressure increases, so does the jacket plasma density. This is due to larger number density of gas molecules in the jacket 130 and a more efficient plasma generation. Beyond critical pressure $P_O$, the population of gas molecules within control gas jacket 130 continues to increase; however, the effective electrical conductivity and electromagnetic shielding effect of jacket plasma 130 start to decrease due to collisional dumping of jacket plasma 130. With control gas jacket 130 pressure increasing beyond $P_O$, the environment of control gas plasma jacket 130 becomes highly collisional for activated plasma species and results in rapid annihilation of many excited species. This minimizes jacket plasma conductivity and the absorption of electromagnetic energy within the control gas plasma jacket 130. As a result, the control gas jacket conductance, $G_J$, decreases, causing plasma generation tube plasma 144 conductance, $G_P$, to increase. This is due to a larger process plasma 144 density within plasma generation tube 142 as a result of a higher electromagnetic power absorption within process plasma 144.

Although FIG. 4 indicates that the jacket critical control gas pressure, $P_O$, for maximum jacket plasma density necessarily relates minimum processing throughput to maximum jacket plasma density, there may be instances where a minimum jacket plasma density does not necessarily indicate a minimum throughput or rate. This is due to the fact that plasma conductivity is not only related to plasma density, but also it is influenced by the mobilities of charged electrons and ions. As a result, the critical pressure corresponding to maximum control gas plasma density, $P_O$, may not be necessarily the same as the critical jacket pressure for maximum jacket plasma electrical conductivity. The graphs in FIG. 4 for jacket plasma density 202 and process throughput 200 vs. jacket pressure are representative examples of variations of these physical parameters with control jacket gas pressure. In reality, the peak jacket plasma density may not correspond to maximum jacket plasma conductivity and minimum microwave power flow into process plasma medium 144; however, the general behavior of process throughput vs. control jacket pressure will still be similar to the graph 200 shown in FIG. 4 with a processing rate minimum achieved at some intermediate critical pressure. If remote microwave plasma 146 is the only process activation or energy source (such as in an isotropic microwave etch reactor), the minimum process throughput or rate (such as etch rate) may approach zero (when the jacket gas pressure is adjusted for maximum jacket plasma conductivity). However, in systems with multiple process activation or energy sources (such as an etch reactor with both RF plasma and remote microwave plasma), the minimum processing rate (corresponding to a minimum remote microwave plasma density) may be a finite non-zero value. As a result, several factors affect the modulation range of processing throughput. In general, the relationship between control gas jacket 130 plasma density and processing throughput or rate can be considered to exist to the extent that processing rate or throughput is responsive over a wide range to fabrication process plasma density and, as a result, to control jacket 130 gas pressure and flow rate.

FIG. 5 is a detailed drawing of a preferred embodiment of double-well discharge tube of present invention for use with a microwave discharge cavity. According to FIG. 5, plasma source module 100 receives process gas 102 at plasma gas inlet line 160. Control gas flow jacket 130 is positioned within jacket flow tube 120. Control gas inlet 126 receives control gas 128. Control gas 128 proceeds to control gas jacket 130 which surrounds plasma generation tube 142. Process gas enters through plasma generation tube inlet 140 and goes to process plasma generation tube 142. Plasma process gas exits plasma generation tube 142 through remote plasma tube inlet 146 and passed plasma outlet tube 20. Remote plasma tube collar 146 attaches to both control gas jacket tube 120 and plasma generation tube 142. A control gas outlet provides a path for control gas 128 to exit control gas jacket 120. Plasma 144 from remote plasma tube inlet 146 proceeds along remote plasma tube 20 into plasma processing chamber (not shown).

In the embodiment of FIG. 5, control gas jacket 120 and plasma generation tube 142 are made of pure quartz formed to accommodate the requirements of a fabrication reactor known as the "Advanced Vacuum Processor" ("AVP") manufactured by Texas Instruments of Dallas, Tex. In a preferred embodiment, plasma generation tube 142 for use in the Texas Instruments AVP has an outside diameter of 0.750 inches with a 0.06 inch thick quartz wall. Control gas jacket 120 has a 1.250 inch outside diameter with a 0.1 inch thick quartz wall. As a result, control gas jacket 130 has a gap width of 0.15 inch. This jacket dimension provides a good control for the typical process gases that the AVP uses and for the variety of control gases that control gas gap 130 can accommodate. In this embodiment, plasma generation tube 142 has a length of about 10.25 inches; control gas jacket 120 a length of 10.5 inches. These dimensions work well to produce desired variable control of process plasma density in an AVP with a fixed magnetron microwave power source and microwave power applicator.

Control gas jacket 130 thickness is a critical design parameter for plasma process control module 100. The thickness of control gas jacket 130 strongly affects the modulation sensitivity and the dynamic range or modulation depth of process plasma density control for plasma process control module 100. If the control jacket thickness is too large (e.g. over 0.2 inches), the large-scale process plasma density modulation by control gas jacket may occur over a very small range of control gas pressures and/or flow rates. As a result, the optimum control jacket thickness is fairly small. This will ensure that the process gas plasma density will have a controlled large-scale variation over a finite and relatively wide range of control gas jacket pressures and/or flow rates. Moreover, the type of gas substance used in the jacket will affect the plasma density adjustment and response sensitivity performance (defined as the change in process plasma density vs. a change or variation of the control gas jacket pressure or gas flow rate). It is desirable to select a control jacket thickness and control gas substance such that the response sensitivity of the plasma density controller is not too large. For the optimum choices of jacket thickness, control gas substance, and control gas flow rate (or pressure), the plasma density controller will allow a controlled variation of the process plasma density over a finite and relatively wide range of control gas pressures (or flow rates) between two extreme levels (minimum and maximum) of plasma densities. Gases such as air, oxygen, and sulfur-hexafluoride ($SF_6$) can be used in the control gas jacket. Gases with a large concentration of negative ions (such as $SF_6$ and $O_2$) are preferred for use in the control jacket. This choice will ensure that the lowest possible control jacket plasma density and electrical conductivity is low enough to cause negligible microwave energy absorption in the jacket. The thickness of control gas jacket 130, obviously, may vary from one plasma fabrication reactor to another. It is important, however, that control gas jacket 130 be properly sized for control gas plasma conductance to responsively and properly effectuate the power divider relationship with process plasma conductance.

FIG. 6 shows a feedback control system 150 for controlling the operation of plasma processing control module 100. In FIG. 6, process gas 102 enters plasma process control module 100 from gas line 14. Continuing in process plasma line 14 process gas 102 enters plasma generation tube 142 and a plasma medium is generated via electrical gas discharge with a controlled density. This occurs by electromagnetic gas discharge and energy absorption from the magnetron power source. From plasma generation tube 142, plasma continues through remote plasma tube 20 to process chamber 24 (not shown). Control gas jacket 130 surrounds plasma generation tube 142. Microwave discharge cavity or applicator 18 surrounds control gas jacket 130 and process plasma tube 142. Microwave source 38 attaches to microwave discharge cavity 18 and emits there within electromagnetic energy via microwave power coupling antenna 138.

Plasma detector box 166 attaches to remote plasma tube 20 outside discharge cavity 18 and contains photodetector 168. Photodetector 168 measures plasma emission intensity which is related to process plasma density and concentrations of activated charged and neutral species. It is also possible to use an alternative sensor probe to directly measure plasma density. Photodetector 168 output signal goes to amplifier 170, whose output passes through feedback or closed-loop line 172 to differential amplifier 174. Plasma intensity or density set point 176 provides another input to differential amplifier 174. Amplifier 174 feeds its difference output signal to controller 178 which provides suitable control signals via control signal line 180 to throttle valve 182. Throttle valve 182 variably controls pumping conductance output from control gas outlet 132 to vacuum pump line 184 and adjusts jacket 130 gas pressure.

Flow of control gas 128 is adjusted according to the flow set point 186 to mass flow controller 188. Mass-flow controller 188 provides control gas to control gas line 190 which attaches to gas inlet 126 of control gas jacket 130. Thus, control gas flow begins at mass-flow controller 188, continues through gas line 190, to control gas flow rate through inlet 126 and gas jacket 130. From control gas jacket 130, control gas 128 exits through gas outlet 132 to variable throttle valve 182 and on to vacuum pump line 184.

The system 150 of FIG. 6 provides feedback control for real-time process plasma 144 intensity or density control by varying control gas jacket 130 pressure in response to the sensed plasma intensity. Photodetector 168 detects the emission intensity of plasma 144 as it flows from plasma generation tube 142 to remote plasma tube 20. Based on the value of plasma emission intensity or plasma density set point 176, amplifier 174 will send a difference or error signal resulting from a comparison of amplified output from photodetector 168 and plasma emission intensity set point 176. Depending on whether control gas jacket pressure should increase or decrease, respectively, control signals from controller 178 will cause throttle valve 182 to decrease or increase the effective pumping flow conductance. Sensor box 166 ensures that light and other external influences do not adversely affect photodetector 168 signal.

Based on a desired fixed flow rate for control gas 128, controller 178 can variably adjust pressure within control gas jacket 130. Also, depending on desired intensity of plasma 144 for a fixed control gas jacket pressure, controller 178 can be reconfigured to provide output signal to control gas mass-flow controller for real-time adjustments of control gas flow rate. For this type of operation, mass flow controller 188 maintains the flow of control gas 128 according to flow set point 186 provided by the feedback controller 178.

An example of how the feedback control system of FIG. 6 works may be as follows: Suppose a semiconductor wafer processing recipe requires a certain plasma 144 density level to provide a desired processing rate. Feedback control system 150 operates to maintain the desired plasma emission intensity or density throughout the fabrication process. To do this, photodetector 168 senses the photoemissivity of plasma 144 within remote plasma tube 20 and sends the sensed signal to amplifier 174. Based on the difference between the sensed and set point 176 levels, the error signal from amplifier 174 to controller 178 is adjusted. If the sensed plasma intensity and the plasma intensity set point are the same, amplifier 174 will not send a signal to change the feedback control signal 180. On the other hand, if the two signals are not the same, controller 178 receives an error signal from amplifier 174 that causes throttle valve 182 to further open or close. When throttle valve 182 changes, control gas jacket 130 pressure changes. In response to changing control gas jacket 130 pressure, plasma density within control gas jacket 130 changes resulting in a change of process plasma density. According to the relationship explained in the discussion of FIGS. 3 and 4, change in this manner will continue until sensed plasma intensity equals the set-point plasma intensity. This process ensures that the difference between the sensed and the set-point levels remain at near zero during the entire plasma fabrication process.

Feedback control system 150 operates by varying the control gas 128 pressure within control gas jacket 130. An alternative arrangement of feedback control system 150 is a system that instead of varying control gas jacket 130 pressure, varies control gas 128 flow rate through control gas jacket 130. Such a system may include a fixed throttle valve 182 or a constant-pressure jacket pressure controller and a feedback control circuit coupled with a mass-flow controller such as controller 188. That controller would operate in response to a difference between sensed plasma intensity from photodetector 168 and a setpoint plasma intensity 176. That type of configuration, however, would send control signals from controller 178 to mass-flow controller 188 instead of to throttle valve 182 (assuming that the throttle valve is controlled separately with a different controller in order to maintain a constant jacket gas pressure).

Photodetector 168 can be any silicon phototransistor or silicon photodiode or photomultiplier tube (PMT) capable of sensing the photo emission of process plasma 144 within the remote plasma tube 20. Amplifiers 170 and 174 are commercially-available amplifiers capable of providing necessary amplification and comparison for the purposes of the feedback control system of FIG. 6. Controller 178, throttle valve 182, and mass-flow controller 188 are also commercially available.

FIG. 7 plots some experimentally measured polysilicon etch rates within fabrication reactor 10 on the scale from 0 to 40 angstroms per second versus control jacket 130 air pressure in the range from 0 to 800 Torr (air used as control gas). For the process that FIG. 7 describes, a mixture of 100 sccm of argon gas and 20 sccm of sulfur-hexafluoride gas ($SF_6$) makes the plasma etch process medium. A radio-frequency (RF) chuck within the process chamber of the fabrication reactor emits 20 watts of RF (13.56 MHz) power into process plasma near the wafer. 25 sccm of air serves as control gas 128. Line 204 indicates the measured relationship between the polysilicon etch rate and control gas jacket 120 air pressure (for a fixed air flow rate of 20 sccm).

The plot of FIG. 7 shows the modulation effect that control gas jacket 130 air pressure has on polysilicon etch rate. Thus, the etch rate can be modulated by the adjustment of control jacket 130 air pressure. The exact shape of curve 204 may vary depending on the particular control gas in control gas jacket 130. The line bars of FIG. 7 show the experimental standard deviations or one-sigma etch nonuniformities of the etch rates that were measured on each etched wafer in this example. FIG. 7 also shows, in the square symbol at the bottom of the plot, that with no RF power from the radio-frequency chuck and no air flow in control gas jacket 128, the polysilicon etch rate is very small (with only remote microwave plasma).

The plot of FIG. 8 shows a more refined view of curve 204. Concentrating on control jacket 130 air pressure axis in the range of 0 to 100 Torr and polysilicon etch rate axis in the range of 15 to 40 angstroms per second, FIG. 8 shows more clearly that changes of control gas jacket 130 pressure yield a significant etch rate modulation effect. This validates the concepts of the plasma property controller 100 of the present invention. These results were obtained without any closed-loop control circuitry to maintain constant plasma emission intensity.

An alternative embodiment of the present invention may include yet a second concentric control gas jacket surrounding control gas jacket 130. In this configuration, one of the control jackets may control plasma density. The other control jacket may control impedance matching or tuning for microwave power absorption. The purpose of tuning with the second control jacket would be to optimize the power absorption by process plasma. Tuning is typically necessary because of electrical impedance mismatches between plasma load and electromagnetic power source. Impedance matching between process gas 102 and electromagnetic power source, minimizes reflection of microwave energy into the source as both control gas 128 and process gas 102 generate plasma discharges. Reflection of power from both the control gas 128 and process gas 102 during plasma generation, can damage the magnetron microwave source. By impedance matching between the two electrical loads, a more controllable plasma 144 results with longer lifetime of electromagnetic power source 38.

Although the invention has been described with reference to the above specific embodiments, this description is not meant to be construed in a limiting sense. Various modifications of the disclosed embodiment, as well as alternative embodiments of the invention, will become apparent to persons skilled in the art upon reference to the above description. It is, therefore, contemplated that the appended claims will cover such modifications that fall within the true scope of the invention.

What is claimed is:

1. A plasma density controller for semiconductor device processing equipment for controlling the amount of plasma activation for a process gas as a result of absorbing gas discharge energy from a gas discharge energy source, comprising:
   a jacket interposed between the gas discharge energy source and the process gas, said jacket adapted for the presence of a control fluid having the ability to variably control the amount of plasma-generating energy that the process gas receives; and
   controls for variably adjusting said control fluid physical parameters to influence the amount of energy the process gas absorbs.

2. The controller of claim 1, wherein said control fluid comprises a control gas, said control gas being capable of controllably generating a plasma as a result of absorbing energy from said energy source.

3. The controller of claim 1, wherein said control fluid comprises a control liquid, said control liquid having the ability to variably control the amount of plasma-generating energy that the process gas receives.

4. The controller of claim 1, wherein said control fluid jacket housing comprises an insulating material.

5. The controller of claim 4, wherein said insulating material is quartz.

6. The controller of claim 4, wherein said insulating material is sapphire.

7. The controller of claim 4, wherein said insulating material is made of a ceramic material.

8. The controller of claim 1, wherein said control fluid comprises a gas capable of generating a plasma in an electromagnetic energy field having a frequency of approximately 2.45 GHz.

9. The controller of claim 1, wherein said control gas comprises a gas capable of producing a plasma through radio-frequency inductively-coupled discharge.

10. The controller of claim 1, wherein said control gas comprises a gas capable of producing a plasma through radio-frequency capacitively-coupled discharge.

11. The controller of claim 1, wherein said plurality of controls further comprises a substance flow controller for variably controlling the fluid flow rate through said control fluid jacket.

12. The controller of claim 1, wherein said plurality of controls further comprises a valve assembly for adjustably controlling pressure within said control fluid jacket.

13. A method for controlling the amount of plasma density that a process gas generates as a result of absorbing energy from an energy source, comprising the steps of:
   interposing a variably controllable fluid between the energy source and the process gas; and
   variably controlling said control fluid to influence the amount of energy the process gas medium absorbs.

14. The method of claim 13, wherein said variably controllable fluid comprises a control gas.

15. The method of claim 13, wherein said variably controllable fluid comprises a control liquid.

16. The method of claim 13, further comprising the step of variably controlling flow within said control fluid jacket.

17. The method of claim 13, further comprising the step of variably controlling pressure within said control fluid jacket.

18. The method of claim 13, further comprising the step of detecting fabrication plasma physical properties.

19. The method of claim 18, further comprising the step of automatically controlling pressure within said control gas jacket in response to process plasma density or emission intensity measurements.

20. The method of claim 18, further comprising the step of automatically controlling the flow rate through said control fluid jacket in response to process plasma density measurements.

21. A semiconductor fabrication plasma density controller for controlling the process density of a fabrication process plasma under the influence of plasma-generating energy in a process gas flow line, comprising:
   a jacket surrounding the process gas flow line;
   a control gas flowing within said jacket for producing a control plasma, said control plasma associated to prevent a predetermined aspect of the plasma-generating energy from entering the process flow line; and
   a plurality of controls associated with said jacket for variably controlling the extent to which said control plasma prevents the plasma-generating energy from influencing the process plasma.

22. The apparatus of claim 21, wherein said jacket comprises an insulating material.

23. The apparatus of claim 22, wherein said insulating material is quartz.

24. The apparatus of claim 23, wherein said insulating material is sapphire.

25. The apparatus of claim 23, wherein said insulating material is a ceramic material.

26. The apparatus of claim 21, wherein said control gas produces plasma at a microwave frequency of approximately 2.45 GHz.

27. The apparatus of claim 21, wherein said control gas produces plasma in a radio-frequency inductively-coupled gas discharge.

28. The apparatus of claim 21, wherein said control gas produces plasma in a radio-frequency capacitively-coupled gas discharge.

29. The apparatus of claim 21, wherein said plurality of controls further comprises a flow controller for variably controlling the fluid flow rate within said jacket.

30. The apparatus of claim 21, wherein said plurality of controls further comprises a valve for variably controlling pressure within said jacket.

31. The apparatus of claim 21, wherein said plurality of controls further comprises a detector for detecting fabrication process plasma density.

32. The apparatus of claim 21, wherein said plurality of controls further comprises a photodetector for detecting fabrication process plasma emission intensity.

33. The apparatus of claim 30, wherein said plurality of controls further comprises circuitry for automatically varying control fluid flow rate in response to detected fabrication plasma density or emission intensity.

34. A method for remotely controlling semiconductor fabrication plasma density of a fabrication process plasma under the influence of plasma-generating energy in a flow line, comprising the steps of:
 disposing a jacket around the flow line;
 flowing a control fluid within said jacket to produce a control plasma from said control fluid;
 associating said control plasma with the plasma-generating energy to prevent a predetermined aspect of the plasma-generating energy from entering the flow line; and
 associating a plurality of controls with said control plasma to thereby variably control the amount of plasma-generating energy entering the process plasma flow line.

35. The method of claim 34, wherein said jacket is formed of an insulating material.

36. The method of claim 34, further comprising the step of automatically varying control plasma density in response to variations in process plasma density or emission intensity.

37. A system for remotely controlling semiconductor fabrication process plasma density, comprising:
 a semiconductor device fabrication reactor for fabricating a plurality of semiconductor wafers;
 an energy source for emitting plasma-generating gas discharge energy;
 a fabrication process gas for producing a fabrication process plasma by absorbing said plasma-generating energy; and
 a semiconductor fabrication plasma density controller for controlling the density of said process plasma, said controller comprising:
  a control fluid jacket disposed around said fabrication process gas and having a control gas gap;
  a control fluid within said control fluid gap associated to absorb a portion of said plasma-generating energy and prevent a portion of said plasma-generating energy from producing said process plasma; and
  a plurality of controls for variably controlling properties associated with said control fluid to control the amount of plasma-generating energy said control fluid prevents from being absorbed by said process plasma.

38. The system of claim 37, wherein said plasma energy source comprises a fixed microwave source.

39. The system of claim 37, wherein said microwave source comprises an energy source for emitting electromagnetic energy having a frequency of approximately 2.45 GHz.

40. The system of claim 37, wherein said source comprises a variably controllable microwave source.

41. The system of claim 37, wherein said energy source comprises a radio-frequency induction coil surrounding said control gas jacket and said fabrication process gas.

42. The system of claim 37, wherein said energy source comprises a radio-frequency capacitive coupling electrode surrounding said control gas jacket and said fabrication process gas.

43. The system of claim 37, wherein said control gas jacket comprises an insulating material.

44. The system of claim 37, wherein said insulating material is quartz.

45. The system of claim 37, wherein said insulating material is sapphire.

46. The system of claim 37, wherein said insulating material is ceramic material.

47. The system of claim 37, wherein said plurality of controls comprises a flow controller for variably controlling the fluid flow rate within said control fluid jacket.

48. The system of claim 37, wherein said plurality of controls further comprises a valve assembly for variably controlling gas pressure within said control fluid jacket.

49. The system of claim 37, further comprising circuitry for automatically controlling said control fluid parameters in response to measured variations in process plasma density or emission intensity.

50. The system of claim 49, wherein said circuitry further comprises a feedback control system for continually comparing actual fabrication process plasma density or emission intensity to desired process plasma density setpoints.

* * * * *